(12) United States Patent
Mason et al.

(10) Patent No.: US 9,039,425 B2
(45) Date of Patent: May 26, 2015

(54) ELECTRICAL INTERCONNECT DEVICE

(71) Applicant: TYCO ELECTRONICS CORPORATION, Berwyn, PA (US)

(72) Inventors: Jeffrey Walter Mason, North Attleboro, MA (US); Wayne Stewart Alden, III, Whitman, MA (US)

(73) Assignee: Tyco Electronics Corporation, Berwyn, PA (US)

( * ) Notice: Subject to any disclaimer, the term of this patent is extended or adjusted under 35 U.S.C. 154(b) by 83 days.

(21) Appl. No.: 13/746,127

(22) Filed: Jan. 21, 2013

(65) Prior Publication Data

US 2014/0206234 A1    Jul. 24, 2014

(51) Int. Cl.
*H01R 12/00* (2006.01)
*H01R 13/6581* (2011.01)
*H01R 12/52* (2011.01)
*H01R 13/24* (2006.01)

(52) U.S. Cl.
CPC ............ *H01R 13/6581* (2013.01); *H01R 12/52* (2013.01); *H01R 13/2414* (2013.01)

(58) Field of Classification Search
CPC ................... H01R 23/6873; H01R 13/65802
USPC ............ 439/607.1, 607.12, 60, 66, 91, 924.1
See application file for complete search history.

(56) References Cited

U.S. PATENT DOCUMENTS

| | | | |
|---|---|---|---|
| 4,387,388 A * | 6/1983 | Zakhariya | 257/697 |
| 5,854,514 A | 12/1998 | Roldan et al. | |
| 6,007,349 A | 12/1999 | Distefano et al. | |
| 6,274,820 B1 | 8/2001 | DiStefano et al. | |
| 6,669,490 B1 | 12/2003 | DelPrete et al. | |
| 6,848,914 B2 | 2/2005 | Beaman et al. | |
| 6,942,494 B2 | 9/2005 | Watson | |
| 6,989,681 B2 | 1/2006 | Maekawa et al. | |
| 7,241,680 B2 | 7/2007 | Boggs et al. | |
| 7,385,288 B2 | 6/2008 | Boggs et al. | |
| 7,549,870 B2 | 6/2009 | Mason et al. | |
| 7,572,131 B2 | 8/2009 | Alden, III et al. | |
| 7,704,077 B1 | 4/2010 | Morley | |
| 7,722,360 B2 | 5/2010 | Millard et al. | |
| 7,726,976 B2 | 6/2010 | Mason et al. | |
| 7,785,111 B2 | 8/2010 | Hilty et al. | |
| 7,815,442 B2 | 10/2010 | Hsu et al. | |
| 7,887,335 B2 | 2/2011 | Morley | |
| 8,007,287 B1 | 8/2011 | Champion et al. | |
| 8,029,324 B1 | 10/2011 | Yi et al. | |
| 8,063,481 B2 | 11/2011 | Li | |
| 8,550,825 B2 | 10/2013 | Mason et al. | |
| 8,787,035 B2 | 7/2014 | Mason et al. | |
| 8,926,343 B2 | 1/2015 | Mason et al. | |

* cited by examiner

*Primary Examiner* — Phuongchi T Nguyen

(57) ABSTRACT

An electrical interconnect device includes a substrate and an array of conductive elastomeric columns held by the substrate each having opposite first and second ends and being internally conductive between the first and second ends. A shield is mounted exterior of the first ends of the elastomeric columns. The shield has an insulative carrier holding an array of conductive pads. The conductive pads have inner surfaces and outer surfaces where the inner surfaces of the conductive pads engage the first ends of corresponding elastomeric columns and where the outer surfaces are configured to engage corresponding mating contacts of an electrical component. The outer surfaces of the conductive pads are non-coplanar such that the conductive pads have different heights. Optionally, the conductive pads may have different thicknesses above the carrier.

19 Claims, 5 Drawing Sheets

ELECTRICAL INTERCONNECT DEVICE

BACKGROUND OF THE INVENTION

The subject matter herein relates generally to electrical interconnect devices for use between opposed arrays of contacts.

Interconnect devices are used to provide electrical connection between two or more opposing arrays of contacts for establishing at least one electrical circuit, where the respective arrays may be provided on a silicon package, an electronic device, a printed circuit board, a Pin Grid Array (PGA), a Land Grid Array (LGA), a Ball Grid Array (BGA), and the like. In one interconnect technique, the electrical connection is provided by an interconnect device that is physically interposed between corresponding electrical contacts of the opposing arrays of contacts.

At least some known interconnect devices use an array of conductive elastomeric columns supported on a substrate. The elastomeric columns may be compressed to establish reliable contact between the opposing contacts and provide the electrical connection between the opposing contacts. In other known interconnect devices, the elastomeric columns are non-conductive and the electrical connection is provided via a separate contact or trace. The interconnect devices are capable of accommodating size constraints, such as related to the reduced physical size of many electrical devices.

However, the electrical connection may be unreliable due to height variations between electrical contacts of the opposing arrays, variations in thickness of a substrate supporting either of the opposing arrays or the conductive elements of the interconnect device, warping of a substrate of either of the opposing arrays, and the like. For example, during soldering of the interconnect device to the electronic device or package, the package may warp (sometimes known as "potato chipping" where the edges of the package are turned upward). In some cases, the warping causes unreliable connections in such locations in the form of partial connections or even no connections at all. To accommodate for such warping or bowing of the package, some packages include different size solder balls on the same package to ensure adequate amounts of solder material are present for soldering. Problems may arise and it may be difficult to connect with electrical devices or packages that have different solder ball sizes because of the height variation in the mating interfaces of the solder balls.

A need remains for an electrical interconnect device that is capable of reliably connecting to an electronic device or package having different size solderballs.

BRIEF DESCRIPTION OF THE INVENTION

In one embodiment, an electrical interconnect device is provided including a substrate having opposite first and second outer surfaces and an array of conductive elastomeric columns held by the substrate. Each of the elastomeric columns have opposite first and second ends and the elastomeric columns are internally conductive between the first and second ends. A shield is mounted exterior of the first ends of the elastomeric columns. The shield has an insulative carrier holding an array of conductive pads arranged in a complementary pattern as the array of elastomeric columns. The conductive pads have inner surfaces and outer surfaces where the inner surfaces of the conductive pads engage the first ends of corresponding elastomeric columns and where the outer surfaces are configured to engage corresponding mating contacts of an electrical component. The outer surfaces of the conductive pads are non-coplanar such that the conductive pads have different heights. Optionally, the conductive pads may have different thicknesses above the carrier.

Optionally, the conductive pads may be arranged in a first group and a second group. The outer surfaces of the conductive pads of the first group may be coplanar with one another and the outer surfaces of the conductive pads of the second group may be coplanar with one another; however, the outer surfaces of the conductive pads of the first group may be non-coplanar with the outer surfaces of the conductive pads of the second group. The conductive pads of the first group may be arranged along an outer perimeter of the array of conductive pads. The outer surfaces of the conductive pads of the first group may be arranged below the outer surfaces of the conductive pads of the second group. The conductive pads of the first group may be etched to shorten the conductive pads of the first group relative to the conductive pads of the second group. Optionally, the conductive pads may be mated with solder balls of the electrical component. The conductive pads of the first group may accommodate larger diameter solder balls of the electrical component as compared to the conductive pads of the second group because the outer surfaces of the conductive pads of the first group may be positioned further from the electrical component than the conductive pads of the second group.

Optionally, the inner surfaces of the conductive pads may be coplanar. The first ends of the elastomeric columns may be coplanar with the conductive pads extending different heights from the first ends. The shield may be part of the substrate. The substrate may include an inner layer holding the elastomeric columns relative to one another and an outer layer on the inner layer with openings receiving the elastomeric columns. The shield may be coupled to the elastomeric columns over the outer layer of the substrate. The carrier may include an array of voids aligned with corresponding conductive pads with the elastomeric columns received in corresponding voids to engage the conductive pads.

Optionally, a second shield may be mounted exterior of the second outer surface of the substrate. The second shield may have an insulative carrier holding an array of conductive pads engaging the seconds ends of corresponding elastomeric columns. The conductive pads of the second shield may have different heights measured from the second ends of the elastomeric columns.

In another embodiment, an electrical interconnect device is provided having a substrate and an array of compressible conductors held by the substrate. The compressible conductors have first mating interfaces at first ends thereof for mating with corresponding mating contacts of a first electrical component. The compressible conductors have second mating interfaces at second ends thereof for mating with corresponding mating contacts of a second electrical component. The compressible conductors are internally conductive between the first and second ends. The first mating interfaces are non-coplanar such that the compressible conductors have different heights. Optionally, the compressible conductors may include conductive elastomeric columns having first ends and second ends. The first ends may define the first mating interfaces. The conductive elastomeric columns may be of varying heights such that the first mating interfaces are non-coplanar.

DETAILED DESCRIPTION OF THE INVENTION

Figure 1:
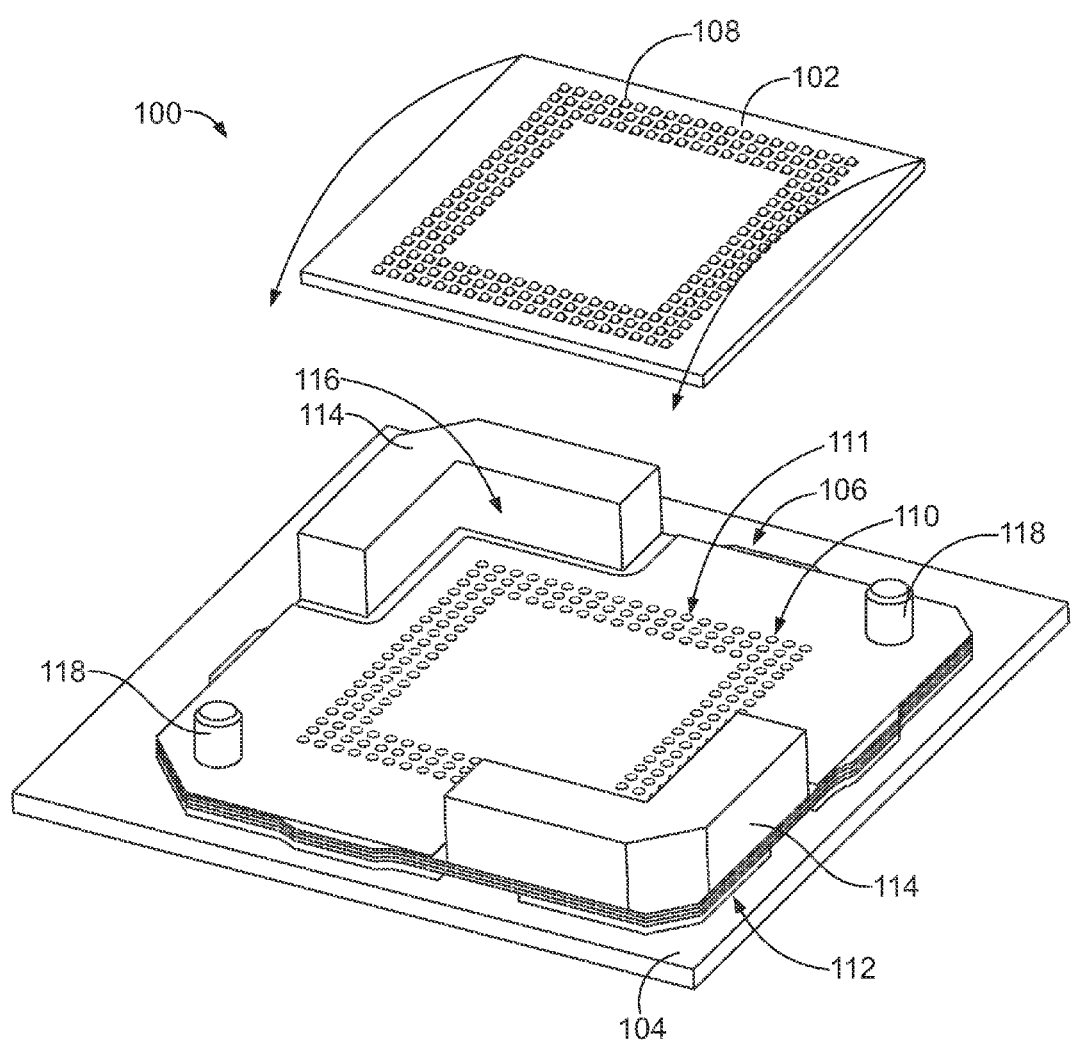
FIG. 1 illustrates an electrical interconnect system formed in accordance with an exemplary embodiment.

FIG. 1 illustrates an electrical interconnect system 100 formed in accordance with an exemplary embodiment. The system 100 includes a first electrical component 102, a second electrical component 104, and an interconnect device 106 sandwiched therebetween. The first and second electrical components 102, 104 both have arrays of contacts, such as ball grid arrays, land grid arrays and the like that are electrically connected together by the interconnect device 106. The interconnect device 106 is illustrated mounted to the second electrical component 104. The first electrical component 102 is illustrated flipped over 180° from the normal loading orientation to illustrate a ball grid array having a plurality of solder balls 108 configured to be connected to the interconnect device 106.

In the illustrated embodiment, the first electrical component 102 is an electronic package, such as a chip or processor. The second electrical component 104 is a circuit board. The interconnect device 106 constitutes a socket that is mounted to the circuit board and is configured to receive the chip.

In an exemplary embodiment, the first electrical component 102 includes solder balls 108 of different sizes, such as different diameters. For example, the solder balls 108 around the perimeter may be larger than the interior solder balls 108 to accommodate for misalignment with the interconnect device 106. For example, the larger solder balls 108 may be positioned to accommodate for warping of the first electrical component 102 as the first electrical component is heated during the soldering operation when the first electrical component 102 is soldered to the interconnect device 106. Warping may cause the edges of the first electrical component 102 to flare upward, requiring more solder material between the first electrical component 102 and the interconnect device 106 along the outer perimeter of the first electrical component 102. The larger solder balls 108 may be used in locations other than along the outer perimeter in alternative embodiments, such as at locations where the first electrical component 102 is spaced further from the interconnect device 106.

In an exemplary embodiment, to mate properly with the first electrical component 102 having the different size solder balls 108, the interconnect device 106 includes multiple height conductors 110 to initially accommodate the different size solder balls 108. For example, the conductors 110 around the outer perimeter may be shorter than other conductors 110 to accommodate the larger size solder balls 108 around the outer perimeter of the first electrical component 102. The shorter conductors 110 may be arranged at other locations in alternative embodiments, such as in locations that correspond to locations of the larger solder balls 108.

The interconnect device 106 has a first mating surface 111 and a second mating surface 112. The first mating surface 111 is configured to be electrically connected to the first electrical component 102. The conductors 110 are arranged along the first mating surface 111 in a complementary pattern as the solder balls 108 for electrical connection with corresponding solder balls 108. The second mating surface 112 is configured to be electrically connected to the second electrical component 104.

The interconnect device 106 includes guide walls 114 that define a socket or receptacle 116 that receives the first electrical component 102. The interconnect device 106 includes alignment features 118 that align the first electrical component 102 within the socket 116. In the illustrated embodiment, the alignment features 118 constitute pins or posts. The guide walls 114 also help align the first electrical component 102 in the socket 116.

In an exemplary embodiment, the electrical interconnect system 100 constitutes a testing system, where the interconnect device 106 is a test socket mounted to a main circuit board, represented by the second electrical component 104. The first electrical component 102 is a test chip configured to be tested in the test socket. One example of a test socket is a burn-in socket used for testing components of the test chip, such as the materials used for manufacturing the chip, at high temperatures, such as a temperature of 150° C. or higher. The test socket is configured for a high volume of cycles during its lifetime, wherein many different test chips are configured to be tested by the test socket. In alternative embodiments, other types of electrical components may be interconnected by the interconnect device 106. For example, both the first and second electrical components 102, 104 may be circuit boards.

Figure 2:
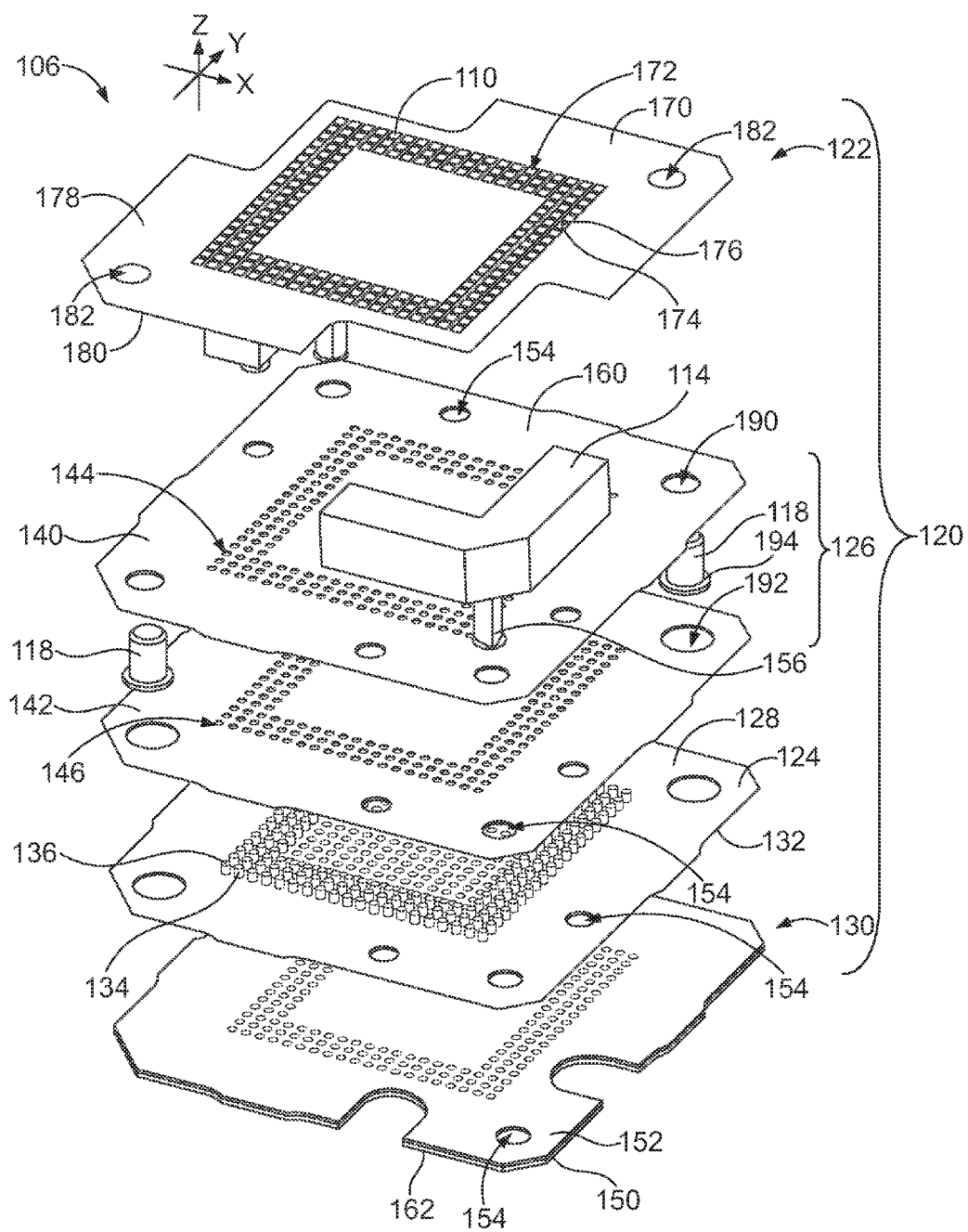
FIG. 2 is an exploded view of an interconnect device for the electrical interconnect system and formed in accordance with an exemplary embodiment.

FIG. 2 is an exploded view of the interconnect device 106 in accordance with an exemplary embodiment. The interconnect device 106 includes a substrate 120 including one or more layers and a shield 122 that is configured to be mounted to the layer(s). The substrate holds and supports conductors that are used to interconnect the first and second electrical components 102, 104.

The substrate 120 includes one or more inner layers 124, one or more outer layers 126 on a first side 128 of the inner layers 124, and one or more outer layers 130 on a second side 132 of the inner layers 124. The first side 128 generally faces the first electrical component 102 (shown in FIG. 1) and the second side 132 generally faces the second electrical component 104 (shown in FIG. 1).

The inner layer 124 includes an insulator or carrier that holds a plurality of elastomeric columns 134. In an exemplary embodiment, the inner layer 124 is fabricated from an insulative material, such as a polyimide material that may be arranged as a polyimide film, such as a Kapton® material. The elastomeric columns 134 are arranged in an array having a predetermined pattern or layout that corresponds to the array of contacts of the first electrical component 102 and the second electrical component 104. The elastomeric columns 134 extend from both the first and second sides 128, 132. The elastomeric columns 134 each extend between a first end 136 and a second end 138 (shown in FIG. 5) opposite the first end 136. In an exemplary embodiment, the columns 134 are frustoconically shaped, being wider about the mid-section and narrower at the first and second ends 136, 138. The columns 134 are held at the mid-section by the inner layer 124. In an exemplary embodiment, the columns 134 are conductive elastomeric columns, such as columns fabricated from a mixture of an elastic material and conductive particles. The columns 134 provide conductive paths between the first and second ends 136, 138. In an exemplary embodiment, the columns 134 are metalized particle interconnects. The columns 134 are at least partially compressible when the first electrical component 102 is mounted to the interconnect device 106. The elastomeric columns 134 define compressible conductors of the interconnect device 106 that electrically interconnect the first and second electrical components 102, 104.

In the illustrated embodiment, the outer layers 126 include two coverlays 140, 142 that may be secured together using adhesive layers. The coverlays 140, 142 are secured to the first side 128 of the inner layer 124, such as by using an adhesive layer. Other layers may be provided in alternative embodiments. The coverlays 140, 142 constitutes a mechanical stop that limits the amount of compression of the elastomeric columns 134 when the first electrical component 102 is being mounted to the interconnect device 106. The coverlays 140, 142 have a plurality of openings 144, 146 that are arranged in a complementary pattern to the columns 134. The columns 134 are received in corresponding openings 144, 146 when the coverlays 140, 142 are attached to the inner layer 124.

In an exemplary embodiment, the two coverlays 140, 142 cooperate to capture the alignment features 118 therebetween. For example, the outer coverlay 140 includes smaller openings 190 for receiving the alignment features 118 than the openings 192 in the inner coverlay 142 that receive the alignment features 118. The alignment feature 118 includes a flange 194 that is received in the opening 192 in the inner coverlay 142. The flange 194 is captured beneath the outer coverlay 140.

In alternative embodiments, a single coverlay may be used rather than the two part coverlay. The alignment features 118 may be held in place relative to the substrate 120 by other means in alternative embodiments.

In the illustrated embodiment, the outer layers 130 include a coverlay 150 and an adhesive layer 152 that secures the coverlay 150 to the second side 132 of the inner layer 124. The outer layer 130 may have other layers in alternative embodiments.

The inner layer 124 and outer layers 126, 130 include a plurality of apertures 154 extending therethrough. The apertures 154 receive various features or components that align the layers 124, 126, 130 with one another and/or with the first and second electrical components 102, 104. For example, the alignment features 118 may be received in corresponding apertures 154. Additionally, the guide walls 114 may includes posts 156 that are received in corresponding apertures 154.

When assembled, the outer layers 126, 130 are positioned on, and may be secured to, the inner layer 124. When assembled, the outer layer 126 defines a first outer surface 160 of the substrate 120 and the outer layer 130 defines a second outer surface 162 of the substrate 120. The shield 122 is configured to be mounted exterior of the first outer surface 160. The shield 122 is configured to be interspersed between the substrate 120 and the first electrical component 102. In the illustrated embodiment, the second outer surface 162 is configured to be mounted to the second electrical component 104. In alternative embodiments, a second shield (not shown), that may be similar or identical to the shield 122 may be mounted exterior of the second outer surface 162.

The shield 122 includes an insulative carrier 170 holding an array of conductive pads 172. The conductive pads 172 are arranged in a complementary pattern as the array of elastomeric columns 134. The conductive pads 172 have inner surfaces 174 (shown in FIG. 5) and outer surfaces 176 opposite the inner surfaces 174. The shield 122 is positioned relative to the substrate 120 such that the inner surfaces 174 of the conductive pads 172 engage the first ends 136 of corresponding elastomeric columns 134. The outer surfaces 176 are configured to engage corresponding mating contacts of the first electrical component 102 (shown in FIG. 1). The outer surfaces 176 define mating interfaces of the interconnect device 102 for directly mating with the first electrical component 102. The conductive pads 172 define an electrical interface between the first electrical component 102 and the elastomeric columns 134. The conductive pads 172 are manufactured from a conductive material, such as copper. The conductive pads 172 are physically held together by the carrier 170 such that each of the conductive pads 172 may be mounted to the substrate 120 as a unit. The conductive pads 172 are arranged on the carrier 170 such that the conductive pads 172 are spaced apart from one another. The conductive pads 172 remain attached to the carrier 170 when mounted to the substrate 120. The conductive pads 172 are electrically isolated from one another by the spacing between the conductive pads 172.

In an exemplary embodiment, the conductive pads 172 define the conductors 110. The conductive pads 172 have different thicknesses such that the conductors 110 may have different heights above the carrier 170. The outer surfaces 176 of some of the conductive pads 172 may be at a first height above the carrier 170, while the outer surfaces 176 of other conductive pads 172 may be a second height above the carrier 170. The different heights of the conductive pads 172 may be used to accommodate differently sized solder balls 108 on first electrical component 102 (shown in FIG. 1). For example, the conductive pads 172 around the outer perimeter (e.g., outer conductive pads) may be shorter than the conductive pads 172 closer to the center of the array of conductive pads 172 (e.g., inner conductive pads).

The carrier 170 has a first surface 178 and a second surface 180 opposite the first surface 178. The second surface 180 generally faces the substrate 120. The first surface 178 generally faces the first electrical component 102 when mounted to the interconnect device 106. Optionally, the conductive pads 172 may be provided on the first surface 178. For example, the inner surfaces 174 of the conductive pads 172 may extend along, and be secured to, the first surface 178. Alternatively, the conductive pads 172 may be provided on the second surface 180. In other alternative embodiments, the conductive pads 172 may be held at an intermediate position between the first and second surfaces 178, 180.

The carrier 170 is manufactured from a dielectric material, such as a polyimide. The carrier 170 is an insulator that holds the conductive pads 172. In an exemplary embodiment, the carrier 170 is a thin film such as Kapton® polyimide film. The carrier 170 includes one or more shield alignment features 182 that engage the alignment features 118 to position the shield 122 with respect to the substrate 120. In the illustrated embodiment, the shield alignment features 182 constitute apertures through the carrier 170. The apertures receive the posts defining the alignment features 118 to position the shield 122 exterior of the first outer surface 160.

In an exemplary embodiment, the carrier 170 is held generally parallel to the substrate 120 with the conductive pads 172 aligned above, and engaging the first ends 136 of the elastomeric columns 134. In an exemplary embodiment, and as described in further detail below, the carrier 170 is able to float, for example in the Z direction, above the substrate 120. The alignment features 118 hold the position of the carrier 170, for example the carrier 170 is held in the X and Y directions by the alignment features 118, but the carrier 170 is able to move toward and away from the first outer surface 160, such as when the first electrical component 102 is mated to the interconnect device 106. In an exemplary embodiment, when the first electrical component 102 is mated to the interconnect device 106, the first electrical component 102 compresses the elastomeric columns 134 moving the first electrical component 102 closer to the first outer surface 160 as the first electrical component 102 is moved to a fully mated position. The carrier 170 moves with the first electrical component 102 toward the first outer surface 160 as the first electrical component 102 is moved to the final mated position. In an exemplary embodiment, the conductive pads 172 remain pressed against the first ends 136 of the elastomeric columns 134 during the entire time the carrier 170 and first electrical component 102 are pressed toward the first outer surface 160. When the carrier 170 bottoms out against the first outer surface 160, the first electrical component 102 is in the final mated position and further compression of the elastomeric columns 134 is restricted by the mechanical stop defined by the coverlay 140 and the carrier 170.

Optionally, the electrical interconnect device 102 may hold the elastomeric columns 134 without the use of the internal layers, but rather the substrate 120 only includes the shield 122 and a similar shield on the opposite side with the elastomeric columns 134 held therebetween. The outer surfaces of the substrate 120 are defined by the outer surfaces of the carriers 170 of the shields 122 and the conductive pads 172 are applied directly to the carriers 170 over the corresponding elastomeric columns 134. The conductive pads 172 have different heights or thicknesses.

Figure 3:
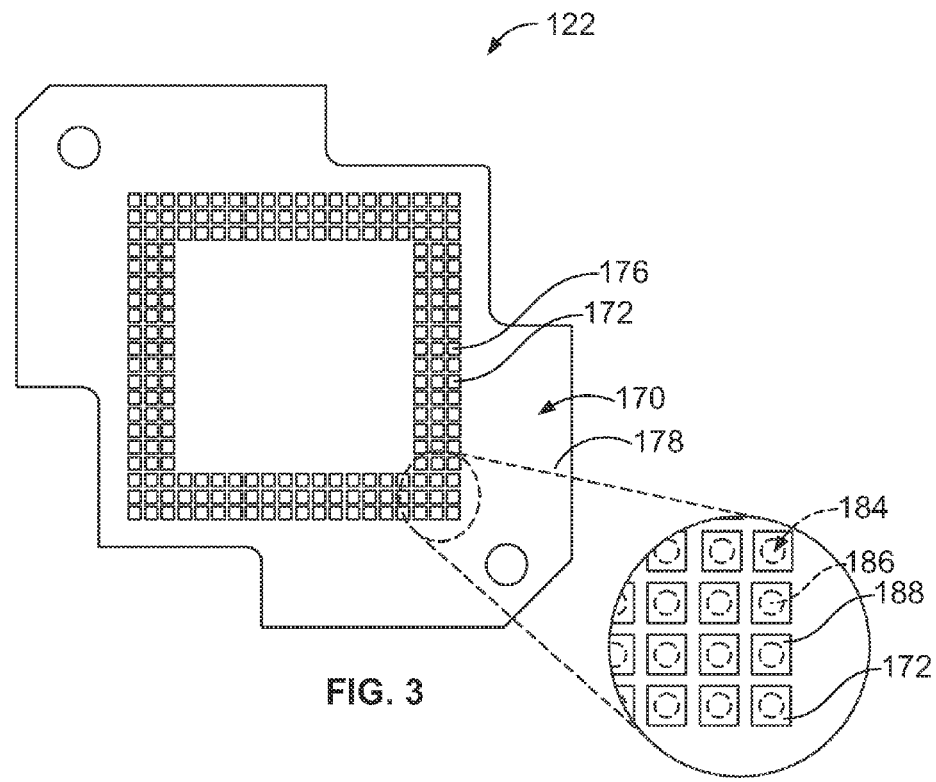
FIG. 3 is a top view of a shield of the interconnect device.
Figure 4:
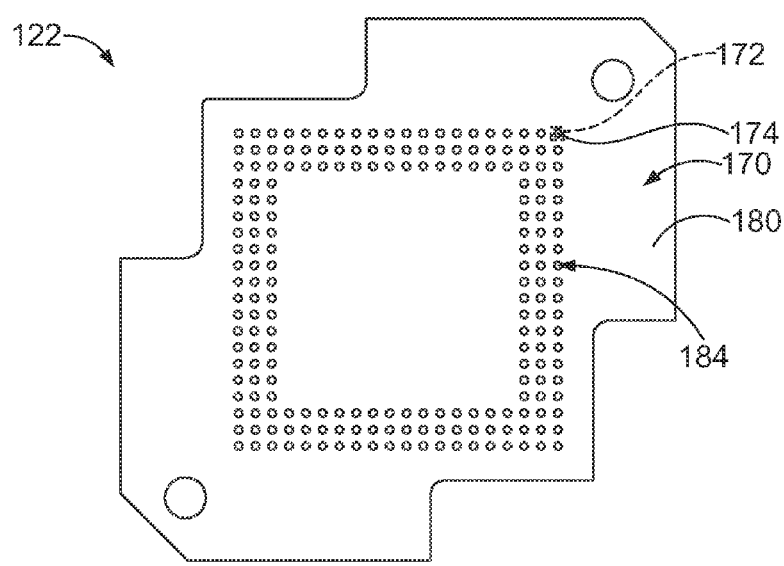
FIG. 4 is a bottom view of a shield of the interconnect device.

FIGS. 3 and 4 are top and bottom views, respectively, of the shield 122. The first surface 178 of the carrier 170 is illustrated in FIG. 3. The conductive pads 172 are shown on the first surface 178 of the carrier 170. The outer surfaces 176 of the conductive pads 172 are exposed along the first surface of the carrier 170. Any number of conductive pads 172 may be provided. The conductive pads 172 may be arranged in any pattern, depending on the particular application. The second surface 180 of the carrier 170 is illustrated in FIG. 4.

In an exemplary embodiment, the carrier 170 includes an array of voids 184 extending between the first and second surfaces 178, 180. The voids 184 are formed entirely through the carrier 170. The voids 184 are aligned with corresponding conductive pads 172. The inner surfaces 174 of the conductive pads 172 are exposed by the voids 184. The voids 184 are configured to receive the first ends 136 of the elastomeric columns 134 (both shown in FIG. 2) when the shield 122 is mounted to the substrate 120 (shown in FIG. 2). The elastomeric columns 134 are received in corresponding voids 184 to engage the conductive pads 172.

As shown in FIG. 3, an enlarged area of the shield 122 is illustrated. The conductive pads 172 cover the voids 184. The conductive pads 172 are secured to the portion of the carrier 170 surrounding the voids 184. Each of the conductive pads 172 has a void portion 186 and a carrier portion 188 that surrounds the void portion. The void portions 186 are aligned with the corresponding voids 184. The carrier portions 188 are aligned with the portions of the carrier 170 surrounding the voids 184. The conductive pads 172 are secured to the carrier 170 at the carrier portions 188. In an exemplary embodiment, the conductive pads 172 are sized and shaped differently than the voids 184. For example, the conductive pads 172 are larger than the voids 184 to increase the surface area of the carrier portions 188. Having a large surface area for the carrier portions 188 may increase the mechanical stability of the conductive pads 172. In an exemplary embodiment, the conductive pads 172 are secured to the carrier 170 by bonding the conductive pads 172 to the carrier 170. The conductive pads 172 may be secured to the carrier 170 by other means in alternative embodiments.

In an exemplary embodiment, the shield 122 is manufactured by providing a copper clad on a polyimide film that defines the carrier 170. The copper clad is etched or otherwise selectively removed, leaving the conductive pads 172 on the carrier 170. Optionally, a thickness of each conductive pad 172 may be controlled by the etching process. For example, the amount of etching may control the thickness of the conductive pad 172. Optionally, the copper clad may be subjected to multiple etching processes, where different portions of the copper clad are etched differently during the different etching processes. Such a process may form conductive pads 172 of different thicknesses. For example, the copper clad may be initially etched to form remove portions of the clad, leaving behind the conductive pads 172. Select conductive pads 172 may be masked, and then a second etching process may be performed to remove portions of the unmasked conductive pads 172, removing a thickness of the unmasked conductive pads 172 but still leaving behind a portion of the unmasked conductive pads 172. Such a process shortens the unmasked conductive pads, leaving the masked conductive pads at the original thickness.

Other processes may be used to provide different thickness conductive pads. For example, two clads may be applied to the carrier 170 having different properties that cause the clads to be etched differently during an etching process. Different amounts of the clads may be removed during an etching process, leaving conductive pads of different thicknesses. In other embodiments, two clads of the same material but having different thicknesses are applied to the carrier 170. The etching process affects the clads the same; however, after the etching process, the thicker clad defines thicker conductive pads while the thinner clad defines thinner conductive pads.

The voids 184 are formed in the carrier 170 either before or after the conductive pads 172 are formed and secured to the carrier 170. The voids 184 may be formed by laser drilling the polyimide film. The voids 184 may be formed by other processes in alternative embodiments. In the illustrated embodiment, the voids 184 are circular in cross-section having a predetermined diameter and spacing therebetween. The conductive pads 172 are square in cross-section having a width that is greater than the diameter of the voids 184. The conductive pads 172 have a spacing therebetween that is less than the spacing between the voids 184. The conductive pads 172 have a greater surface area than the cross-sectional area of the voids 184. The shield 122 may be manufactured by other processes in alternative embodiments.

Figure 5:
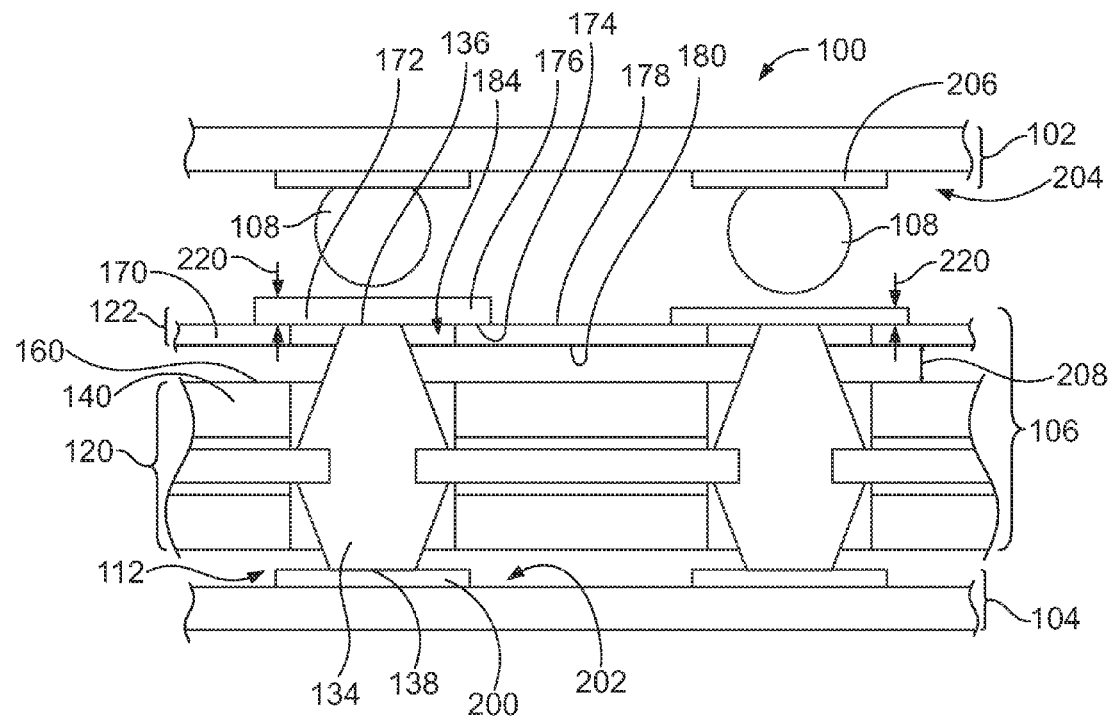
FIG. 5 is a cross-sectional view of the electrical interconnect system.
Figure 6:
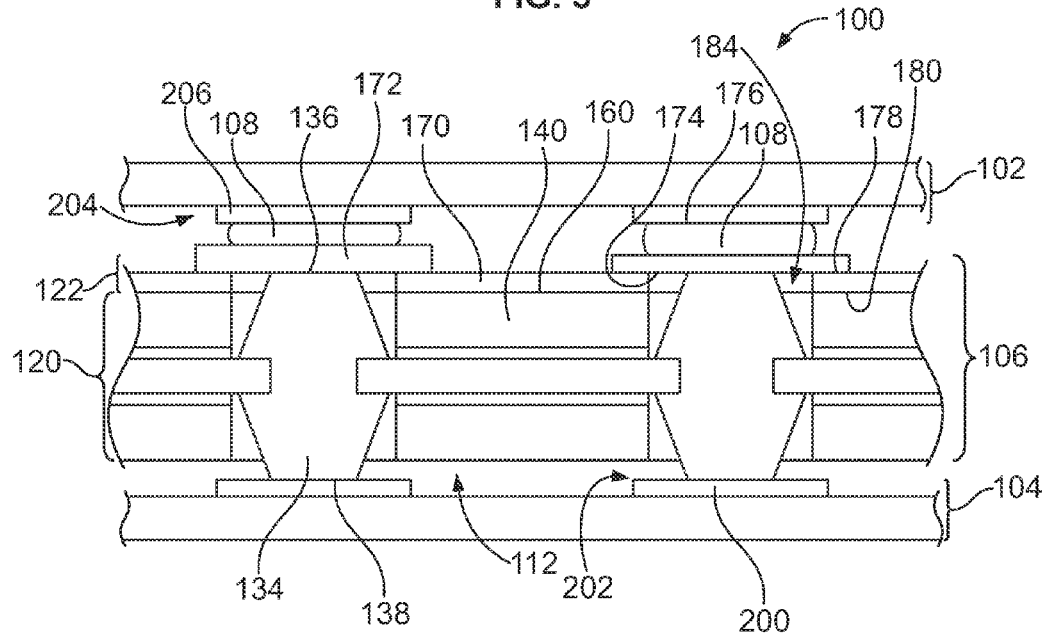
FIG. 6 is a cross-sectional view of the electrical interconnect system.

FIG. 5 is a cross-sectional view of the electrical interconnect system 100 showing the first electrical component 102 in an unmated state. FIG. 6 is a cross-sectional view of the electrical interconnect system 100 showing the first electrical component 102 in a mated state. The interconnect device 106 is terminated to the second electrical component 104. In the illustrated embodiment, the interconnect device 106 is mounted to the second electrical component 104 such that the second ends 138 of the elastomeric columns 134 engage mating contacts 200 on a mating end 202 of the second electrical component 104. The second ends 138 directly engage the mating contacts 200. In an alternative embodiment, a shield, similar to the shield 122, may be provided between the second mating surface 112 and the mating surface 202. In other alternative embodiments, contact caps or other metal contacts may be provided between the second ends 138 and the mating contacts 200. The interconnect device 106 may be secured to the second electrical component 104, such as by using latches, fasteners, or other means to mechanically hold the interconnect device 106 on the second electrical component 104.

The first electrical component 102 is configured to be soldered to the interconnect device 106 at a mating interface defined between a mating end 204 of the first electrical component 102 and the shield 122. In an exemplary embodiment, the first electrical component 102 includes the solder balls 108 at the mating end 204. FIG. 5 illustrates different diameter solder balls 108 with the larger solder ball 108 on the right and the smaller solder ball 108 on the left.

Optionally, the interconnect device 106 may be configured for many mating and unmating cycles. For example, the first electrical component 102 may be mated and unmated from the interconnect device 106, such as by reflowing the solder to remove the first electrical component 102 from the interconnect device 106. In an exemplary embodiment, the interconnect device 106 defines a testing device that tests many different electrical components, such as electronic packages or chips. For example, the interconnect device 106 may define a burn-in socket used to test chips at high heat. The heat may cause warping of the first electrical component 102, so it may be desirable to use more solder, and thus a larger solder ball 108, in some locations. For example, the first electrical component 102 may tend to warp in a manner such that the outer edges bend upward causing the conductors closer to the outside of the first electrical component 102 to lift away from the interconnect device 106. Providing larger solder balls 108 at the conductors around the outer perimeter (e.g., one or more rows) may facilitate maintaining good electrical connections at such areas. During initial mating, such as prior to soldering, the shield 122 accommodates the larger solder balls 108 by using shorter conductive pads 172 in the areas where larger solder balls 108 are used. The shield 122 defines a separable interface for mating with such electronic components. The conductive pads 172 may be mated and unmated from mating contacts 206 of the first electrical component 102 numerous times with minimal fatigue or damage to the outer surface 176 of the conductive pads 172.

When the interconnect device 106 is assembled, the shield 122 is mounted exterior of the first outer surface 160 of the coverlay 140. The elastomeric columns 134 extend beyond the outer surface 160 such that the first ends 136 are elevated above the first outer surface 160 of the coverlay 140. The elastomeric columns 134 are compressible and are configured to be compressed when the first electrical component 102 is mated to the interconnect device 106. FIG. 5 shows the first electrical component 102 in an unmated state, and the elastomeric columns 134 are illustrated at normal uncompressed positions. FIG. 6 illustrates the first electrical component 102 in a mated state, and the elastomeric columns 134 are illustrated at compressed positions.

When assembled, the shield 122 extends over the substrate 120 such that the conductive pads 172 are aligned with the elastomeric columns 134. The elastomeric columns 134 extend into the voids 184 such that the first ends 136 engage the inner surfaces 174 of the conductive pads 172. When the shield 122 is initially mounted to the substrate 120, the second surface 180 of the carrier 170 is spaced apart from the coverlay 140 such that a gap 208 is defined between the carrier 170 and the coverlay 140. When the first electrical component 102 is mated to the interconnect device 106, the first electrical component 102 presses against the first surface 178 of the carrier 170 and the mating contacts 206 press against the conductive pads 172. The force from the first electrical component 102 causes the elastomeric columns 134 to compress and shorten. The carrier 170 is pressed towards the coverlay 140 until the carrier 170 engages the coverlay 140. The carrier 170 is moved toward the coverlay 140 of the substrate 120, reducing the size of the gap 208 until the carrier 170 abuts the coverlay 140. The coverlay 140 and carrier 170 act as mechanical stops and do not allow the first electrical component 102 to press the elastomeric columns 134 any further.

When the first electrical component 102 is removed, the carrier 170 is released from the coverlay 140. After the first electrical component 102 is removed, the gap 208 is again provided between the carrier 170 and the coverlay 140. The conductive pads 172 remain engaged to the first ends 136 of the elastomeric columns 134. Optionally, during use of the electrical interconnect system 100, heat is generated which may cause the conductive pads 172 to bond to the first ends 136 of the elastomeric columns 134. The bond between the conductive pads 172 and the elastomeric columns 134 remains largely, if not entirely, undisturbed when the first electrical component 102 is removed from the interconnect device 106. The first ends 136 of the elastomeric columns 134 are not damaged or degraded during mating and unmating of the first electrical component 102 with the interconnect device 106.

The outer surfaces 176 of the conductive pads 172 are non-coplanar such that the conductive pads 172 have different heights above the carrier 170. Any of the conductive pads 172 may have different heights depending on the particular application and the need for positioning of the mating interfaces, defined by the outer surfaces 176, at such heights. In an exemplary embodiment, the conductive pads 172 have different thicknesses 220 to position the outer surfaces 176 at different heights above the carrier 170. Optionally, the inner surfaces 174 of the conductive pads 172 may be coplanar. The first ends 136 of the elastomeric columns 134 may be coplanar. The conductive pads 172 extend different heights from the first ends 136.

In an exemplary embodiment, the conductive pads 172 may be arranged in a first group and a second group. The outer surfaces 176 of the conductive pads 172 of the first group may be coplanar with one another and the outer surfaces 176 of the conductive pads 172 of the second group may be coplanar with one another; however, the outer surfaces 176 of the conductive pads 172 of the first group may be non-coplanar with the outer surfaces 176 of the conductive pads 172 of the second group. For example, the conductive pads 172 of the first group may be arranged along an outer perimeter of the array of conductive pads 172. The outer surfaces 176 of the conductive pads 172 of the first group may be arranged below the outer surfaces 176 of the conductive pads 172 of the second group. The conductive pads 172 of the first group may be etched to shorten the conductive pads 172 of the first group relative to the conductive pads 172 of the second group. The conductive pads 172 of the first group may accommodate larger diameter solder balls 108 of the first electrical component 102 as compared to the conductive pads 172 of the second group because the outer surfaces 176 of the conductive pads 172 of the first group may be positioned further from the first electrical component 102 than the conductive pads 172 of the second group.

In an alternative embodiment, the shield 122 may be rotated 180° so that the second surface 180 is upward facing. The voids 184 may also be upward facing to create a pocket for receiving the solder balls 108 of the ball grid array of the first electrical component 102. The conductive pads 172 may still have different thicknesses to accommodate the different sized solder balls 108.

Figure 7:
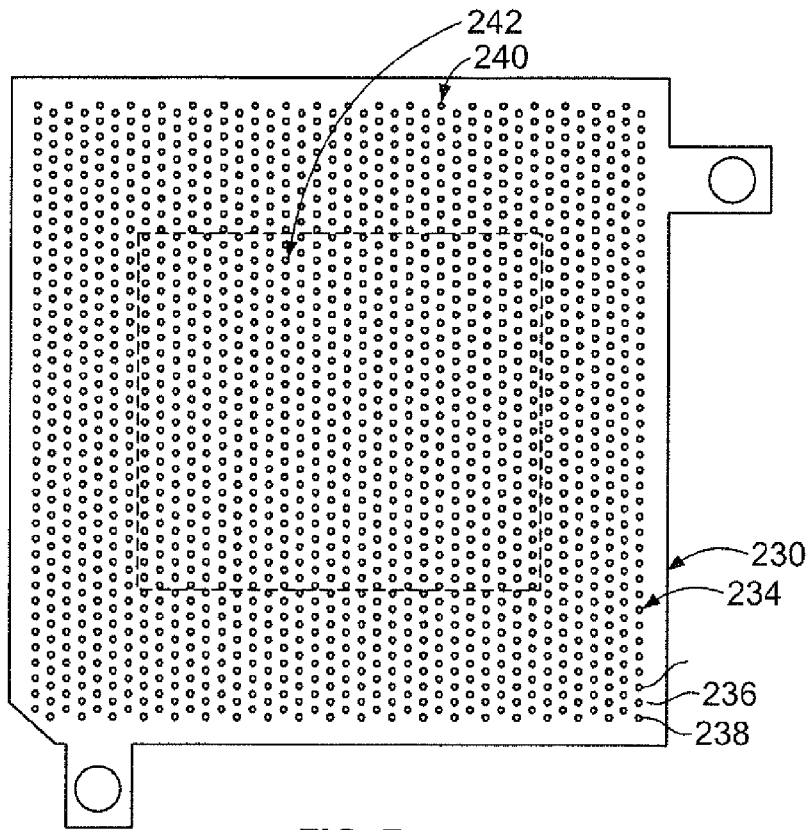
FIG. 7 is a top view of another interconnect device.

FIG. 7 is a top view of another electrical interconnect device 230. The interconnect device 230 may be similar to the interconnect device 106 (shown in FIG. 1); however, the interconnect device 230 includes a different arrangement of conductors 232 for mating with an electrical component 102 having a different arrangement of solder balls. FIG. 7 illustrates a shield 234 of the interconnect device 230, showing a carrier 236 having an array of conductive pads 238, which define portions of the conductors 232. The conductive pads 238 have outer surfaces that define mating interfaces of the conductors 232.

In the illustrated embodiment, the conductors 232 and corresponding conductive pads 238 are arranged in a first group 240 and a second group 242. The first group 240 is arranged around the perimeter of the interconnect device 230. The second group 242 is arranged inside the first group 240 generally around the center of the interconnect device 230. In an exemplary embodiment, the conductive pads 238 of the first group 240 are shorter than the conductive pads 238 of the second group 242 to accommodate larger solder balls and more solder for the conductors 232 around the perimeter as opposed to near the center of the interconnect device 230.

Figure 8:
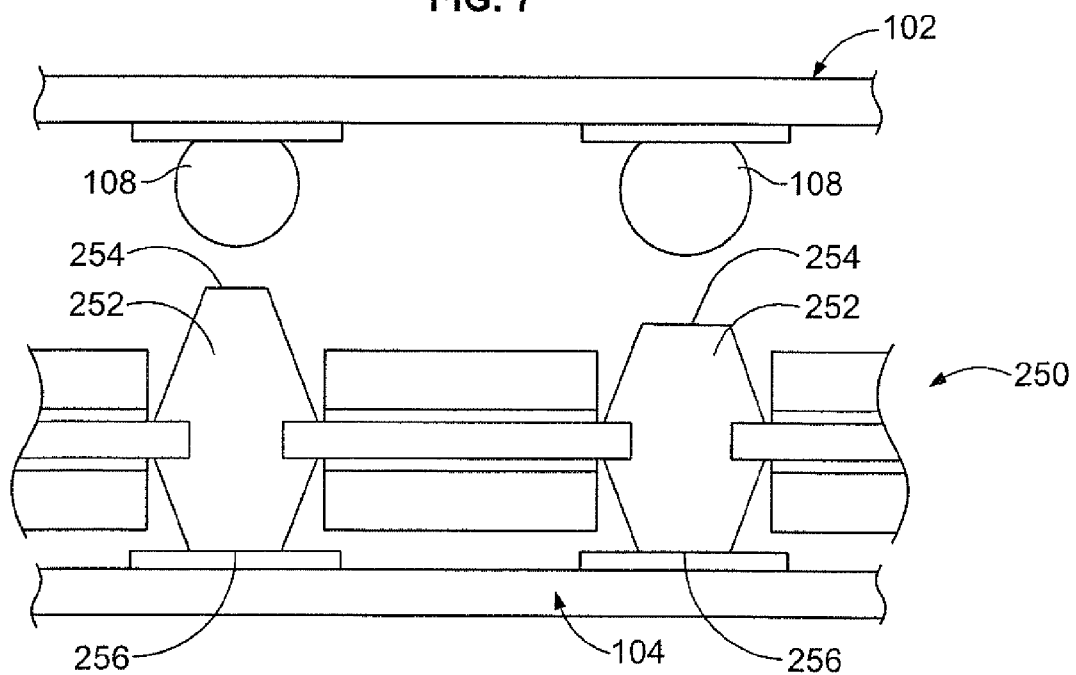
FIG. 8 is a cross sectional view of an electrical interconnect device.

FIG. 8 is a cross sectional view of an electrical interconnect device 250 positioned between the first and second electrical components 102, 104. The interconnect device 250 is similar to the interconnect device 106 (shown in FIG. 1) in some respects; however, the interconnect device 250 does not include the shield 122 with conductive pads 172 (both shown in FIG. 2). The interconnect device 250 includes conductive elastomeric columns 252 defining compressible conductors of the interconnect device 250. The elastomeric columns 252 have first and second ends 254, 256 defining first and second mating interfaces of the compressible conductors. The first and second ends 254, 256 are configured to be directly coupled to the first and second electrical components 102, 104.

In an exemplary embodiment, the elastomeric columns 252 have different heights, causing the first ends 254 to be non-coplanar. Optionally, groups of the elastomeric columns 252 may have each of the elastomeric columns associated therewith of equal height with the corresponding first ends 254 coplanar, but the heights of the elastomeric columns 252 of the different groups may be different, causing some mating interfaces to be at different heights and non-coplanar. Having different height elastomeric columns 252 allows the interconnect device 250 to accommodate different sized solder balls 108.

Other types of compressible conductors may be used in alternative embodiments. For example, the interconnect device may use non conductive elastomeric columns that use separate conductors supported by the columns. The interconnect device may use spring biased contacts having mating interfaces at different heights. The spring biased contacts may be vertically compressible spring biased contacts.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. An electrical interconnect device comprising:
a substrate having opposite first and second outer surfaces;
an array of conductive elastomeric columns held by the substrate, each of the elastomeric columns having opposite first and second ends, the elastomeric columns being internally conductive between the first and second ends; and
a shield mounted exterior of the first ends of the elastomeric columns, the shield having an insulative carrier holding an array of conductive pads arranged in a complementary pattern as the array of elastomeric columns, the conductive pads having inner surfaces and outer surfaces, the inner surfaces of the conductive pads engaging the first ends of corresponding elastomeric columns, the outer surfaces being configured to engage corresponding mating contacts of an electrical component;
wherein the outer surfaces of the conductive pads are non-coplanar such that the conductive pads have different heights.

2. The electrical interconnect device of claim 1, wherein the conductive pads have different thicknesses above the carrier.

3. The electrical interconnect device of claim 1, wherein the inner surfaces of the conductive pads are coplanar.

4. The electrical interconnect device of claim 1, wherein the first ends of the elastomeric columns are coplanar, the conductive pads extending different heights from the first ends.

5. The electrical interconnect device of claim 1, wherein the shield comprises part of the substrate.

6. The electrical interconnect device of claim 1, wherein the substrate comprises an inner layer holding the elastomeric columns relative to one another and an outer layer on the inner layer with openings receiving the elastomeric columns, the shield being coupled to the elastomeric columns over the outer layer of the substrate.

7. The electrical interconnect device of claim 1, wherein the carrier includes an array of voids, the voids being aligned with corresponding conductive pads, the elastomeric columns received in corresponding voids to engage the conductive pads.

8. The electrical interconnect device of claim 1, further comprising a second shield mounted exterior of the second outer surface of the substrate, the second shield having a insulative carrier holding an array of conductive pads engaging the seconds ends of corresponding elastomeric columns, the conductive pads of the second shield having different heights measured from the second ends of the elastomeric columns.

9. The electrical interconnect device of claim 1, wherein the conductive pads are arranged in a first group and a second group, the outer surfaces of the conductive pads of the first group being coplanar with one another, the outer surfaces of the conductive pads of the second group being coplanar with one another, the outer surfaces of the conductive pads of the first group being non-coplanar with the outer surfaces of the conductive pads of the second group.

10. The electrical interconnect device of claim 9, wherein the conductive pads of the first group are arranged along an outer perimeter of the array of conductive pads and the outer surfaces of the conductive pads of the first group are arranged below the outer surfaces of the conductive pads of the second group.

11. The electrical interconnect device of claim 9, wherein the conductive pads of the first group are etched to shorten the conductive pads of the first group relative to the conductive pads of the second group.

12. The electrical interconnect device of claim 9, wherein the conductive pads are configured to be mated with solder balls of the electrical component, the conductive pads of the first group accommodate larger diameter solder balls of the electrical component as compared to the conductive pads of the second group because the outer surfaces of the conductive pads of the first group are positioned further from the electrical component than the conductive pads of the second group.

13. An electrical interconnect device comprising:
a substrate having opposite first and second outer surfaces, the first and second outer surfaces being planar and parallel to each other; and
an array of compressible conductive elastomeric columns held by the substrate, the compressible elastomeric columns having first mating interfaces at first ends thereof for mating with corresponding mating contacts of a first electrical component, the compressible elastomeric columns having second mating interfaces at second ends thereof for mating with corresponding mating contacts of a second electrical component, the compressible elastomeric columns being internally conductive between the first and second ends, the substrate holding a central region of each elastomeric column with the first ends extending beyond the first outer surface and with the second ends extending beyond the second outer surface, the first ends being compressible from an uncompressed state toward the first outer surface, the second ends being compressible from an uncompressed state toward the second outer surface;
wherein the first mating interfaces are non-coplanar such that the compressible elastomeric columns, in the uncompressed state, have different heights measured above the first outer surface.

14. The electrical interconnect device of claim 13, wherein the conductive elastomeric columns have conductive pads capping the conductive elastomeric columns, the conductive pads having different thicknesses such that outer surfaces of the conductive pads are non-coplanar.

15. The electrical interconnect device of claim 13, wherein a shield covers the substrate and the elastomeric columns, the shield having an array of conductive pads capping corresponding the conductive elastomeric columns, the conductive pads having different thicknesses such that outer surfaces of the conductive pads are non-coplanar.

16. The electrical interconnect device of claim 13, wherein the substrate includes a central holder holding the array of compressible elastomeric columns, the compressible elastomeric columns having varying heights above the central holder such that the first mating interfaces are non-coplanar.

17. The electrical interconnect device of claim 13, wherein the compressible elastomeric columns are arranged in a first group and a second group, the first mating interfaces of the compressible elastomeric columns of the first group being coplanar with one another, the first mating interfaces of the compressible elastomeric columns of the second group being coplanar with one another, the first mating interfaces of the compressible elastomeric columns of the first group being non-coplanar with the first mating interfaces of the compressible elastomeric columns of the second group.

18. The electrical interconnect device of claim 17, wherein the compressible elastomeric columns of the first group are arranged along an outer perimeter of the array of compressible elastomeric columns and the first mating interfaces of the compressible elastomeric columns of the first group are arranged below the first mating interfaces of the compressible elastomeric columns of the second group.

19. The electrical interconnect device of claim 17, wherein the compressible elastomeric columns of the first group are etched to shorten the compressible elastomeric columns of the first group relative to the compressible elastomeric columns of the second group.

* * * * *